United States Patent
Zhang et al.

(10) Patent No.: US 6,573,769 B1
(45) Date of Patent: Jun. 3, 2003

(54) PHASE-LOCKED LOOP (PLL) WITH MIXER FOR SUBTRACTING OUTER-BAND PHASE NOISE

(75) Inventors: Michael Y. Zhang, Palo Alto, CA (US); Tat Choi, Saratoga, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 10/064,271

(22) Filed: Jun. 27, 2002

(51) Int. Cl.[7] ................................................. H03L 7/06
(52) U.S. Cl. ........................................ 327/156; 327/147
(58) Field of Search ................................ 327/147, 156, 327/146, 154, 155, 355, 356, 358, 360, 361, 551, 552, 553; 331/25, 17; 375/375, 374, 376

(56) References Cited

U.S. PATENT DOCUMENTS

| | | | |
|---|---|---|---|
| 4,349,916 A | 9/1982 | Roeder | 375/103 |
| 4,613,825 A | 9/1986 | Bickley et al. | 331/4 |
| 4,977,613 A | 12/1990 | Holcomb, Sr. et al. | 455/182 |
| 5,140,198 A | 8/1992 | Atherly et al. | 307/529 |
| 5,254,955 A | 10/1993 | Saeki et al. | 328/155 |
| 5,343,168 A * | 8/1994 | Guthrie | 331/16 |
| 5,517,685 A | 5/1996 | Aoyama et al. | 455/260 |
| 5,563,921 A | 10/1996 | Mesuda et al. | 375/376 |
| 5,757,240 A | 5/1998 | Boerstler et al. | 331/34 |
| 5,825,253 A | 10/1998 | Mathe et al. | 331/18 |
| 5,831,481 A | 11/1998 | Oga | 331/1 A |
| 5,832,027 A * | 11/1998 | Ishigaki | 375/149 |
| 6,236,343 B1 | 5/2001 | Patapoutian | 341/111 |
| 6,370,365 B1 | 4/2002 | Callaway, Jr. et al. | 455/130 |

* cited by examiner

*Primary Examiner*—Timothy P. Callahan
*Assistant Examiner*—Linh Nguyen
(74) *Attorney, Agent, or Firm*—Stuart T. Auvinen (57) ABSTRACT

A phase-locked loop (PLL) includes a final mixer on its output. The final mixer subtracts out a noise or error term from the PLL's output to reduce noise and jitter. A first mixer generates the error term by subtracting a feedback clock from the reference clock. This error term is near D.C. since the feedback and reference clocks are at the same frequency. When this error term is subtracted from the PLL output, a secondary maxima in the noise plot at the PLL's loop bandwidth is removed. A feedback counter receives the output of the voltage-controlled oscillator (VCO) before the final mixer. Outer-band noise created by the VCO is subtracted out by the final mixer, using the error term generated by the first mixer. The mixers reduce noise generated by the VCO or from other sources in the PLL.

20 Claims, 6 Drawing Sheets

PHASE-LOCKED LOOP (PLL) WITH MIXER FOR SUBTRACTING OUTER-BAND PHASE NOISE

BACKGROUND OF INVENTION

This invention relates to Phase-locked loops (PLL's), and more particularly to PLL's with reduced noise.

Digital systems often rely on accurate clocks to synchronize the timing of operations and data transfers. A crystal oscillator can be used to generate a clock at a base frequency, which is then divided or multiplied to create one ore more clocks with desired frequencies. External clock can be received and likewise divided or multiplied to produce internal clocks.

Figure 1:
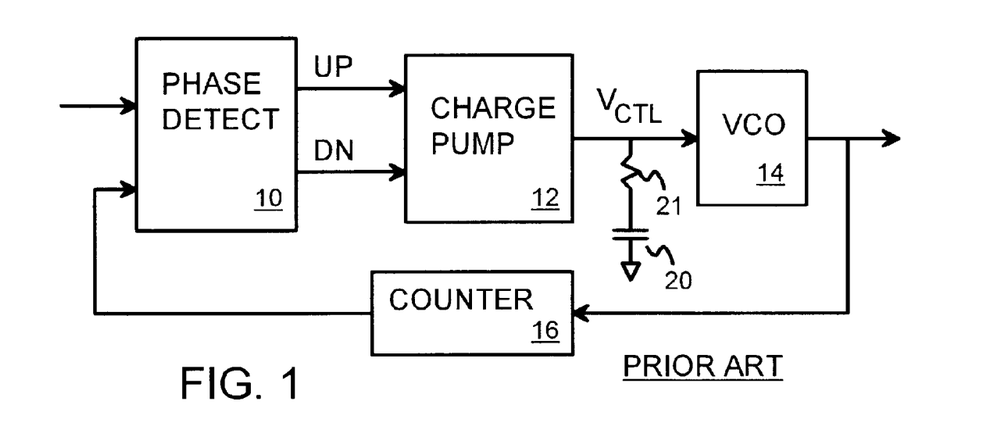
FIG. 1 illustrates a typical PLL.

Clocks are typically generated from oscillator outputs using phase-locked loops (PLL's). PLLs are one of the most widely use building blocks in digital systems today. FIG. 1 illustrates a typical PLL. Phase detector 10 receives a reference-clock input from an external oscillator or clock source. The phase and frequency of the reference clock is compared to the phase and frequency of a feedback clock generated by voltage-controlled,oscillator (VCO) 14. The feedback clock can be the output clock generated by the PLL, or a divided-down derivative of the output clock from VCO 14 such as produced by feedback counter 16.

Phase detector 10 outputs up and down signals UP, DN when the phase or frequency of one input does not match the phase or frequency of the other input. These up and down signals cause charge pump 12 to add or remove charge from filter capacitor 20, which integrates the charge. As charge is added or removed through resistor 21 from filter capacitor 20, the voltage input to VCO 14 is increased or decreased. VCO 14 responds by increasing or decreasing the frequency of the output clock. The feedback clock to phase detector 10 is likewise changed by VCO 14.

As charge pump 12 adds or removes charge from filter capacitor 20, altering control voltage $V_{CTL}$ input to VCO 14, the phase and frequency of the feedback clock are adjusted until the reference clock is matched. Then phase detector 10 stops generating up and down signals to charge pump 12, until charge leaks off filter capacitor 20 or the reference clock changes.

Pulses of short duration are often used for up and down signals UP, DN. For example, phase detector 10 can be a pair of simple flip-flops. One flip-flop outputs the UP pulse when clocked by the reference-clock input. The UP pulse ends when cleared by the feedback-clock input. The other flip-flop generates the DN pulse when clocked by the feedback-clock input. The DN pulse ends when cleared by the reference-clock input. As the phases match more closely, the duration of the pulses shorten.

Often both up and down signals are pulsed simultaneously when no phase adjustment is needed. Charge pump 12 should supply either no charge or equal up and down charges to filter capacitor 20 so that a net zero charge is supplied when the duration of simultaneous UP and DN pulses are identical.

Since clocks are intended to be stable, most of the time charge pump 12 is outputting a net zero charge to filter capacitor 20. If the UP and DN sections of charge pump 12 are not matched exactly, some net charge may be applied to filter capacitor 20. This net charge results in a phase error, since VCO 14 responds by slightly changing the phase and frequency of the feedback clock so that it no longer exactly matches the reference clock.

Figure 2:
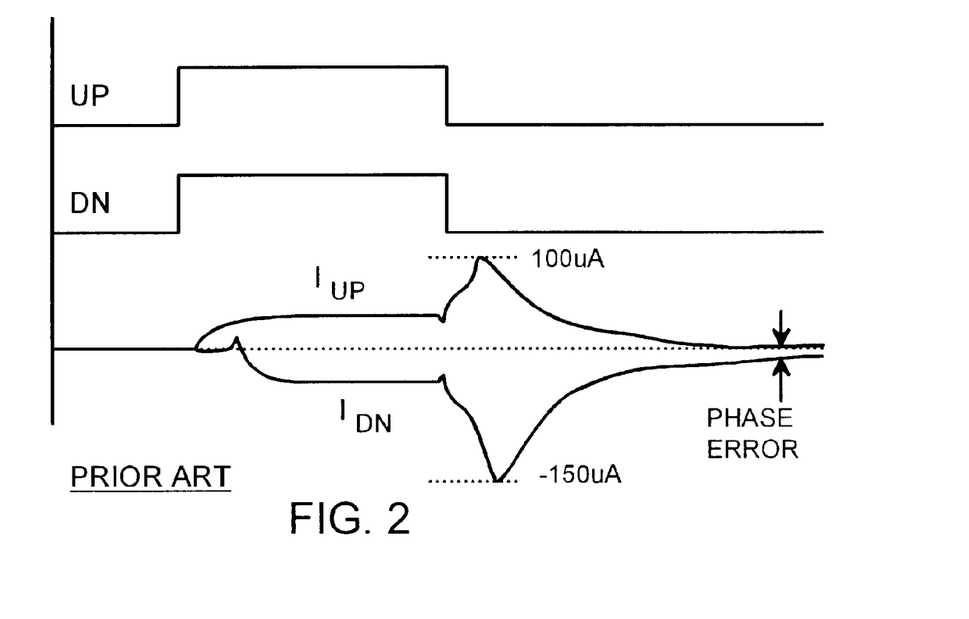
FIG. 2 is a timing diagram of UP and DOWN inputs to a charge pump and the resulting control voltage to the VCO.

FIG. 2 is a timing diagram of UP and DOWN inputs to a charge pump and the resulting control voltage to the VCO. When a leading phase difference is detected by the phase detector, an UP pulse is generated. The charge pump responds to the UP pulse by pumping positive charge to the filter capacitor, increasing the control voltage $V_{CTL}$ to the VCO. The amount of charge pumped to the filter capacitor depends on the duration of the UP pulse. Once the UP pulse ends, the control voltage remains stable.

When a lagging phase difference is detected by the phase detector, a DN pulse is generated. The charge pump responds to the DN pulse by sinking charge from the filter capacitor, decreasing the control voltage $V_{CTL}$ to the VCO. The amount of charge pumped from the filter capacitor depends on the duration of the DN pulse. Once the DN pulse ends, the control voltage remains stable.

Finally, as FIG. 2 shows, the phases are matched and the phase detector outputs both UP and DN pulses simultaneously. The control voltage should not change, but the charge pump is not perfect and causes some noise on the control voltage as transistors in the charge pump are switched on and off by the UP and DN pulses. Should the UP and DN pump transistors not match, a net charge can be added to the control voltage as shown. This net charge is an error caused by the charge pump that reduces the accuracy of the PLL.

Noise is a key metric of a PLL. Noise can be generated by the VCO and other components such as the charge pump. Noise can also be input on the reference clock and propagated to the output. Noise can manifest itself as clock jitter or in other ways.

The noise sources in a PLL system can be separated into noise sources before the loop filter and noise sources after the loop filter. For noise sources after the loop filter, the major contributor is the VCO. The VCO noise can be separated into inner band noise and outer band noise. Inner band noise has a frequency components less than the loop bandwidth, while outer band noise has frequency components greater than the loop bandwidth.

Because noise from the VCO is inserted into the PLL after the loop filter, the outer band noise appears on the output of the PLL. Inner band noise can be compensated by the PLL. For noise sources before the loop filter, the behavior is opposite of VCO noise. The pre-filter inner band noise passes through the loop filter and appears on the output, while the outer band noise is filtered out by the loop filter.

What is desired is a PLL with reduced noise. An improved PLL that removes noise created by the VCO is desirable. Although inner-band noise from the VCO can be suppressed by the loop filter, outer band noise is not suppressed by the loop filter. A PLL with circuitry to reduce outer-band noise from the VCO is desired.

DETAILED DESCRIPTION

The present invention relates to an improvement in noise-reduced phase-locked loops (PLL's). The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 3:
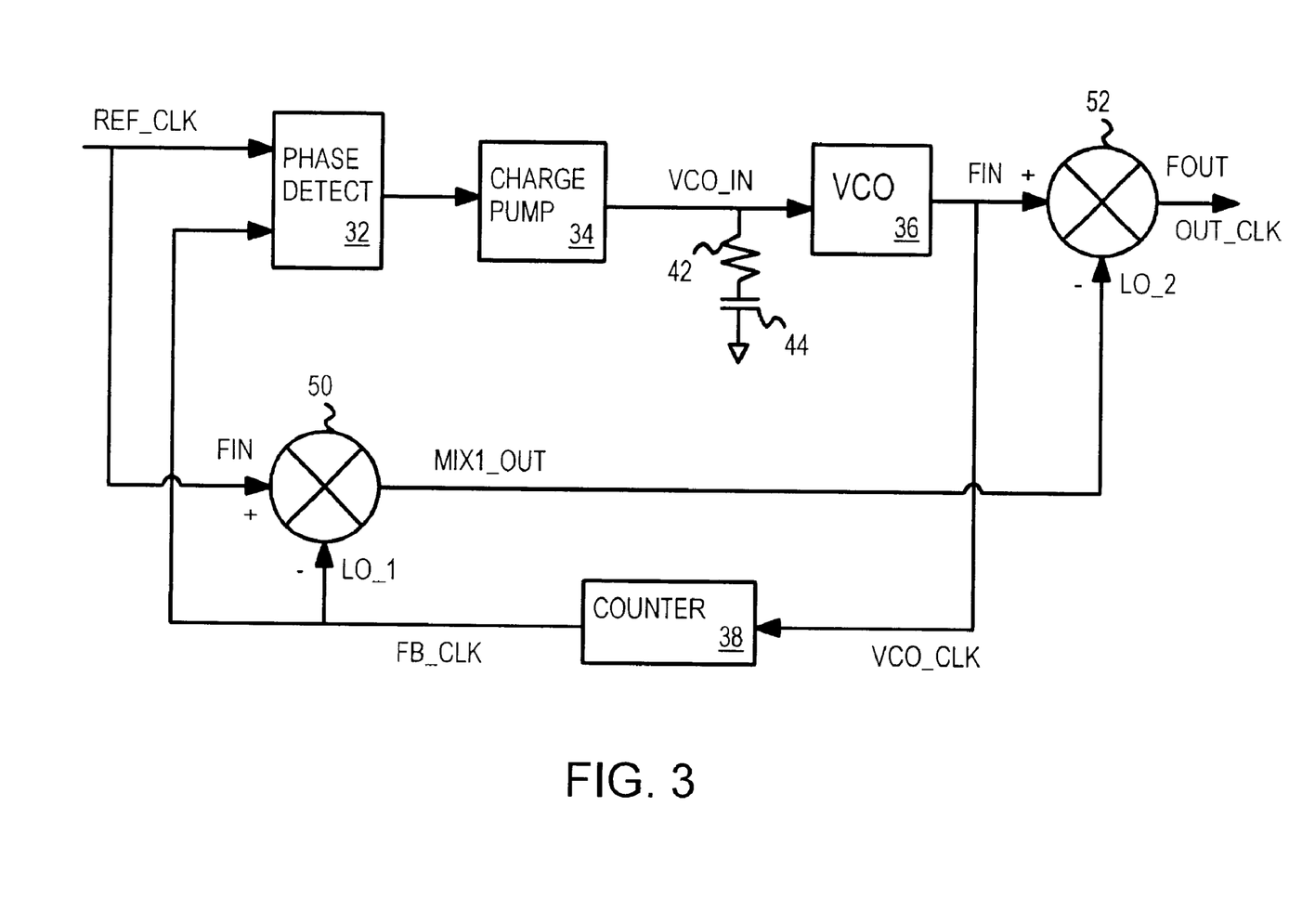
FIG. 3 is a diagram of a PLL with mixers to subtract out noise.

FIG. 3 is a diagram of a PLL with mixers to subtract out noise. A basic PLL structure includes phase detector 32 which compares an input reference clock REF_CLK to a feedback clock FB_CLK that is generated by feedback counter 38. Charge pump 34 is activated by phase detector 32 when phase differences exist between the input and feedback clocks. Charge pump 34 charges or discharges capacitor 44 through resistor 42. Capacitor 44 and resistor 42 form an R-C filter.

VCO 36 senses the voltage on node filter node VCO_IN that responds to the filter charged by charge pump 34. VCO 36 generates a clock VCO_CLK which has a frequency that is dependent on the input voltage on node VCO_IN. The VCO clock VCO_CLK is fed back to the input of feedback counter 38.

Unlike a typical PLL, the final output is generated by output mixer 52 rather than VCO 36. Output mixer 52 subtracts an error term on its LO_2 input from the VCO output VCO_CLK to produce the final output OUT_CLK. The error term on the LO_2 input represents the outer-band noise of the PLL. Thus noise is subtracted from the output VCO clock to generate the final clock.

The error term is generated by first mixer 50, which drives the error term to output mixer 52 on the MIX1_OUT line. First mixer 50 receives the feedback clock FB_CLK from feedback counter 38 and input reference clock REF_CLK. First mixer 50 subtracts the feedback clock from the input reference clock to generate the error term on its output MIX1_OUT.

Mixers 50, 52 can be thought of as time-domain multipliers and frequency-domain addition or subtraction. The output of first mixer 50 is the spectral difference between the input reference clock and the feedback clock.

Since the feedback clock and the reference clock have about the same frequency, and the reference clock is usually a very clean signal (such as from a crystal oscillator), the difference (error term) is near 0 Hertz (D.C.). The difference is the outer-band noise. Thus first mixer 50 generates the outer-band noise as the error term on line MIX1_OUT.

Since the error term is near D.C., subtracting the error term from the VCO output clock does not disturb the output frequency FOUT, which remains near the VCO frequency FIN. Mixer 52 performs subtraction or negative addition of the error term on its LO_2 input from the FIN input.

Subtracting the error term from the output provides a very clean signal on final output clock OUT_CLK. Phase noise is reduced on FOUT compared with FIN. Since the error term that is subtracted is near D.C., it does not upset the fundamental frequency of the PLL. The stability of the PLL is not disturbed by the addition of mixers 50, 52. Generation of jitter from the VCO and other PLL components is effectively reduced using the mixers for noise cancellation.

Figure 4:
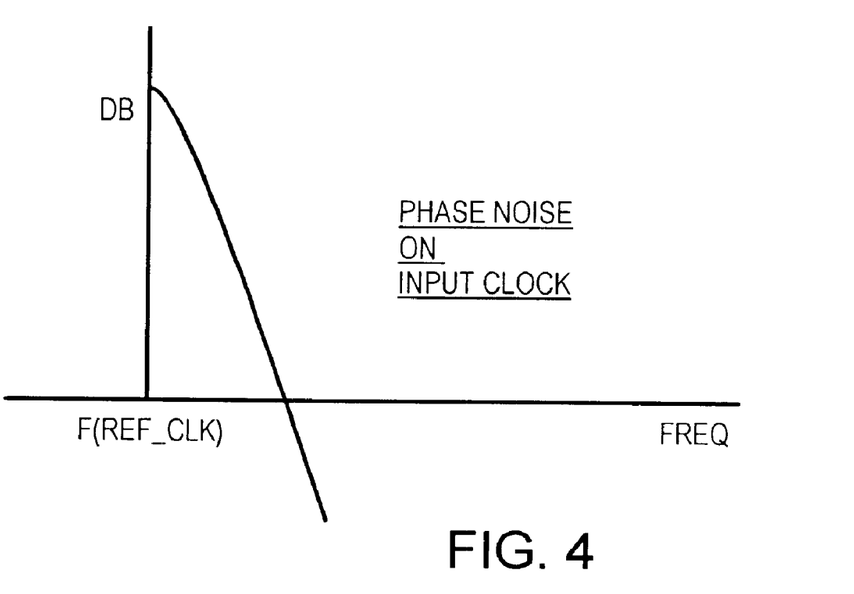
FIG. 4 is a plot of phase noise on the input reference clock.

FIG. 4 is a plot of phase noise on the input reference clock. Noise is greatest near the fundamental frequency of the crystal or oscillator that generates the input reference clock. The crossing of the x and y axes is at the reference frequency, F (REF_CLK), and the x-axis has a log scale The noise, shown in decibels (dB) drops off rapidly at higher frequencies due to the high quality of the crystal oscillator which focuses most of the energy at the reference frequency.

Figure 5A:
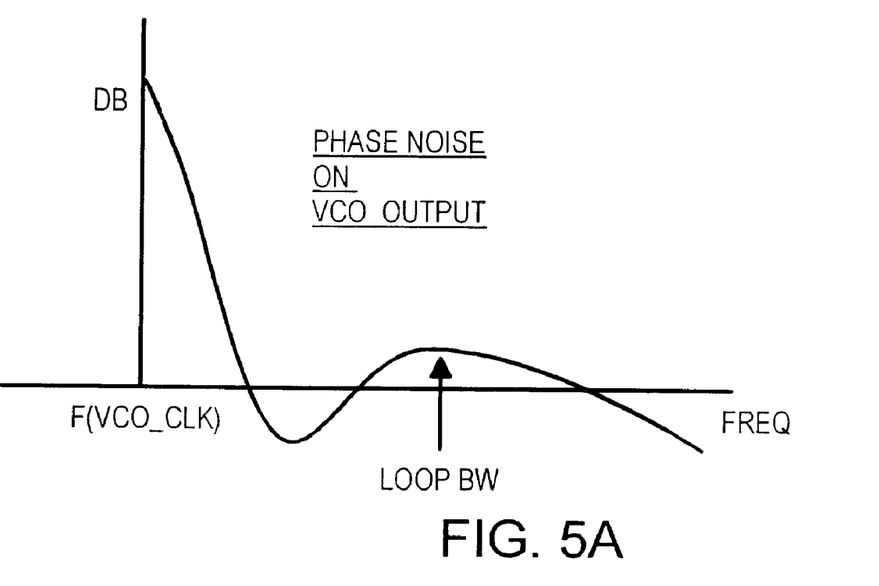
FIG. 5A is a plot of phase noise at the output of the VCO.

FIG. 5A is a plot of phase noise at the output of the VCO. The phase noise at the VCO output (signal VCO_CLK) drops off rapidly from the VCO frequency. The noise rises to a secondary maxima at the loop bandwidth, which is caused by summing the crystal noise, which drops off very rapidly with frequency, and the VCO noise, which drops off less rapidly. Noise tends to be amplified most at the loop bandwidth, since the PLL is operating most efficiently at the loop bandwidth.

A typical prior-art PLL has its output generated by the VCO, so FIG. 5A also shows the noise plot for the output of a prior-art PLL. The phase noise is relatively high at the loop bandwidth, which is undesirable since the PLL is often operating at this frequency where the noise is at a secondary maxima.

Figure 5B:
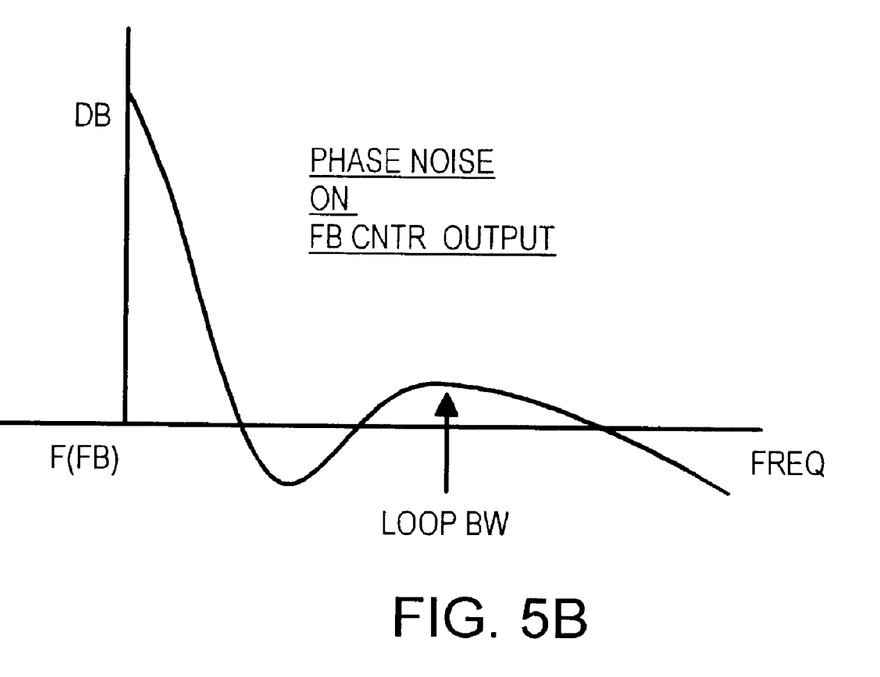
FIG. 5B shows a plot of phase noise at the output of the feedback counter.

FIG. 5B shows a plot of phase noise at the output of the feedback counter. The feedback counter's output is at about the same frequency as the reference clock.

Figure 6:
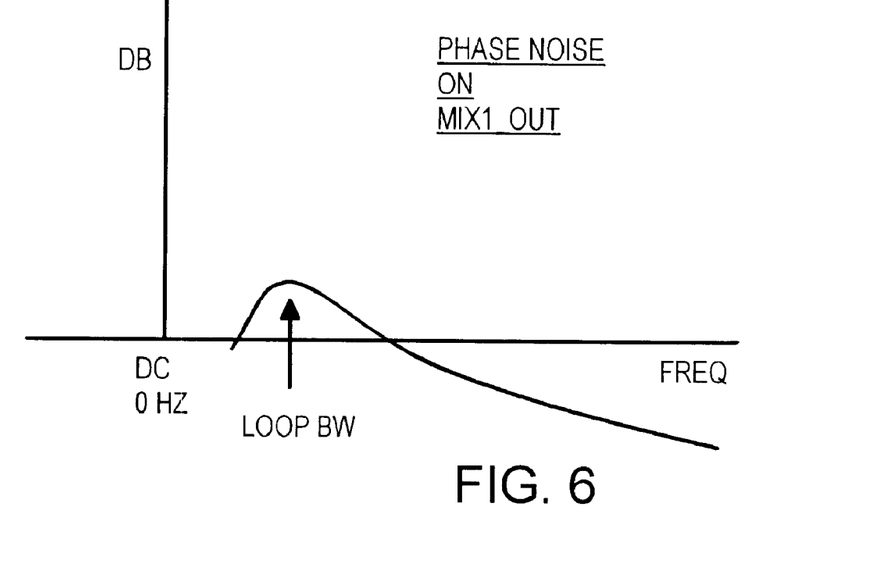
FIG. 6 is a plot of phase noise at the output of the first mixer.

FIG. 6 is a plot of phase noise at the output of the first mixer. First mixer 50 of FIG. 3 subtracts the feedback clock from the input reference clock. Since these two clocks are typically at the same frequency and in phase, the phase difference or phase noise should be zero. However, noise generated by the VCO (outer-band noise) and noise on the input reference clock are present, so a small difference or error term is produced by the first mixer. This error term is plotted in FIG. 6.

When the noise on the reference clock, shown in FIG. 4, is subtracted from the noise on the feedback clock (similar to the plot of FIG. 5A, but shifted along the x-axis due to the counter changing the frequency), the result is the error term plotted in FIG. 6. The large noise spike near the y-axis (the reference and feedback clock frequencies) is subtracted off, leaving just the secondary maxima at the loop bandwidth. Since the feedback counter reduces the frequency of the VCO clock to produce the feedback clock, the location of the loop bandwidth and the secondary maxima is shifted to the left to lower frequencies.

Figure 7:
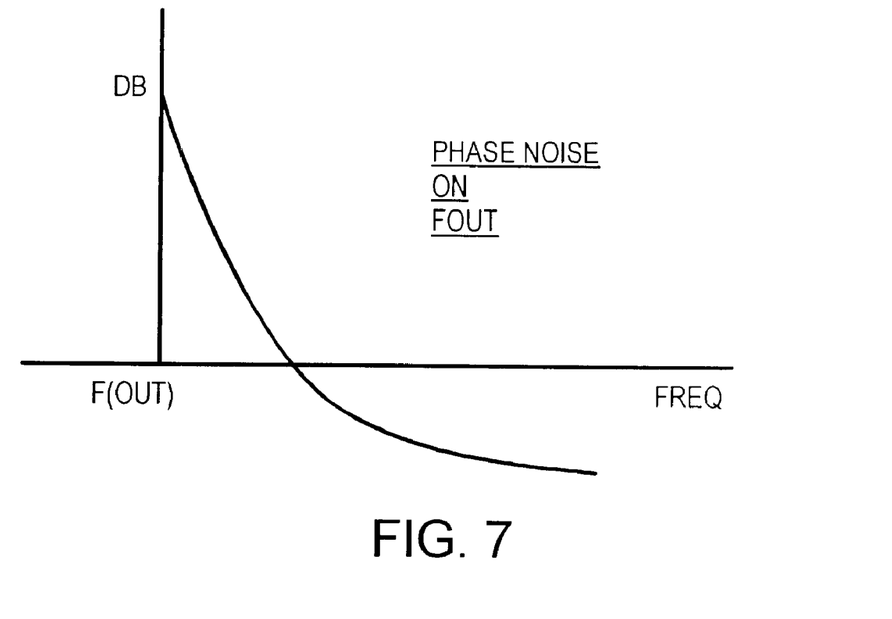
FIG. 7 is a phase-noise plot of the output of the final mixer of the noise-reduced PLL.

FIG. 7 is a phase-noise plot of the output of the final mixer of the noise-reduced PLL. The error term generated by the first mixer is sent to the final mixer along signal line MIX1_OUT. When this error term, shown in FIG. 6, is subtracted from the VCO output noise (FIG. 5), the result is the plot of FIG. 7.

The error term from the first mixer to the final mixer has the secondary maxima near the loop bandwidth. This noise maxima is subtracted from the VCO noise, which also has a secondary maxima near the loop bandwidth. The result is that this secondary maxim of phase noise is subtracted out. The final mixer's output (OUT_CLK at FOUT) does not have a significant maxima at the loop bandwidth. Instead, the phase noise is very low after the initial noise drop-off.

Subtracting the error term significantly reduces phase noise, especially at the higher frequencies near the loop bandwidth. When the phase noise is reduced, jitter is also reduced, since jitter is the time domain representation of phase noise.

Figure 8:
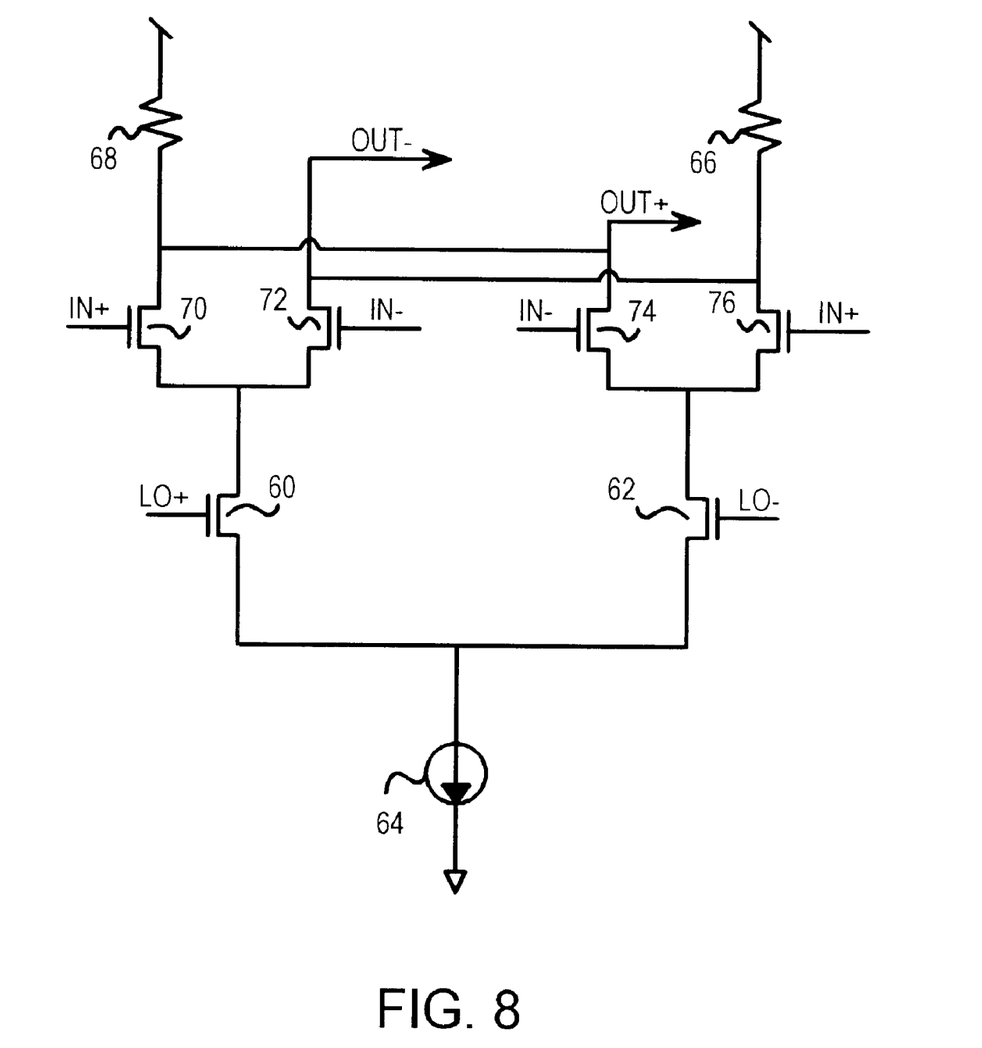
FIG. 8 is a schematic of a mixer.

FIG. 8 is a schematic of a mixer. Mixers can be constructed in a variety of ways. In this example, a Gilbert cell is used which can easily be integrated with other CMOS circuits. Differential signals are used in this embodiment where each logical signal has a true (+) and a complement (−) electrical signal.

Current source 64 draws current from the sources of n-channel differential transistors 60, 62, which have gates driven by true and complement inputs to subtraction port LO_1 of mixer 50. The drain current of differential transistor 60 is split among differential transistors 70, 72, which have gates driven by IN+ and IN−, respectively, of the primary input to the mixer, such as from the reference clock for mixer 50. The drain of differential transistor 70 is connected to the power supply through resistor 68, while the drain of differential transistor 72 drives the complement output of the mixer, OUT−.

The drain current of differential transistor 62 is split among differential transistors 74, 76, which have gates driven by IN− and IN+, respectively, of the primary input to the mixer, such as the reference clock input to mixer 50. The drain of differential transistor 76 is connected to the power supply through resistor 66, while the drain of differential transistor 74 drives the true output of the mixer, OUT+.

The differential tree arrangement of transistors effectively combines the two inputs to the mixer by steering currents among the major and minor branches. Differential inputs can be swapped to add rather than subtract, or to subtract the other input. P-channel rather than n-channel transistors can be used, and the current source may itself be a transistor. Of course, many other kinds of mixer circuits could be substituted. The mixer circuit described is just one of many possible mixer circuits.

ALTERNATE EMBODIMENTS

Several other embodiments are contemplated by the inventors. Other filters can be substituted for resistor 42 and capacitor 44, such as filters with inductances, series resistances, or parallel legs. Additional PLL loops can be added, and more complex circuits can be substituted. The feedback counter may simply divide by one rather than a larger divisor.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word "means" is recited in a claim element, Applicant intends for the claim element to fall under 35 USC §112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A noise-canceling phase-locked loop (PLL) comprising:
   a reference clock input that receives a reference clock with low phase noise;
   a phase comparator that receives the reference clock and a feedback clock and compares phases of the feedback and reference clocks;
   a loop filter that comprises a filter capacitor;
   a charge pump, responsive to a phase difference detected by the phase comparator, for charging and discharging the filter capacitor;
   a voltage-controlled oscillator (VCO) having an input that senses a filter voltage controlled by the filter capacitor, for generating a VCO clock that has a frequency that depends on the filter voltage;
   a feedback counter, receiving the VCO clock and generating the feedback clock;
   a first mixer, receiving the reference clock and receiving the feedback clock, for generating an error term; and
   a final mixer, receiving the VCO clock and the error term from the first mixer, for generating a final clock having reduced phase noise in comparison to the VCO clock,
   whereby noise is reduced by the final mixer.

2. The noise-canceling phase-locked loop of claim 1 wherein the final mixer subtracts the error term from the VCO clock to generate the final clock,
   whereby the final mixer performs subtraction of the error term to reduce noise.

3. The noise-canceling phase-locked loop of claim 2 wherein the first mixer subtracts the feedback clock from the reference clock to generate the error term,
   whereby the first mixer performs subtraction to generate the error term.

4. The noise-canceling phase-locked loop of claim 3 wherein the error term has a maximum value near zero hertz.

5. The noise-canceling phase-locked loop of claim 3 wherein the VCO clock has a secondary maxima near a loop bandwidth of the noise-canceling phase-locked loop.

6. The noise-canceling phase-locked loop of claim 5 wherein outer-band noise having a frequency above the loop bandwidth is reduced by the final mixer,
   whereby the error term cancels outer-band noise when subtracted from the VCO clock by the final mixer.

7. The noise-canceling phase-locked loop of claim 3 wherein the first mixer and the final mixer are differential mixers having differential inputs and differential outputs.

8. The noise-canceling phase-locked loop of claim 3 wherein the loop filter comprises a series resistor and the filter capacitor.

9. A low-jitter clock generator comprising:
   a phase-locked loop PLL having a phase detector that compares a reference clock to a feedback clock to adjust a frequency of a interior clock generated by a variable-frequency clock generator;

a first mixer that receives the feedback clock and the reference clock and generates a noise-representing signal; and a final mixer, coupled between the interior clock and a final clock, the final mixer subtracting the noise-representing signal from the interior clock to generate the final clock, whereby jitter on the final clock is less than jitter on the interior clock.

10. The low-jitter clock generator of claim 9 wherein the PLL further comprises a feedback divider that is clocked by the interior clock and generates the feedback clock.

11. The low-jitter clock generator of claim 10 wherein the variable-frequency clock generator is a voltage-controlled oscillator (VCO).

12. The low-jitter clock generator of claim 11 wherein the PLL further comprises a loop filter that is charged and discharged by the phase detector;

wherein the VCO senses a voltage from the loop filter to determine frequency of the interior clock.

13. The low-jitter clock generator of claim 9 wherein the first mixer generates the noise-representing signal by subtracting the feedback clock from the reference clock.

14. The low-jitter clock generator of claim 9 wherein the first mixer and the final mixer are differential.

15. A phase-noise-canceling clock generator comprising:

phase detect means, receiving an input clock and a feedback clock, for detecting a phase difference between the input clock and the feedback clock;

charge pump means, coupled to the phase detect means, for charging and discharging a filter node;

filter means, attached to the filter node, for storing charge from the charge pump means;

oscillator means, coupled to the filter node, for adjusting an output frequency of an interior clock in response to the filter node;

error-generating means, coupled to receive the input clock and the feedback clock, for generating an error signal;

error-removing means, coupled to the interior clock, for combining the error signal from the error-generating means with the interior clock to generate an output clock.

16. The phase-noise-canceling clock generator of claim 15 wherein the error-removing means includes subtract means for subtracting at least a portion of the error signal from the interior clock to generate the output clock.

17. The phase-noise-canceling clock generator of claim 16 wherein the error-generating means includes subtract means for subtracting at least a portion of the feedback clock from the input clock to generate the error signal.

18. The phase-noise-canceling clock generator of claim 15 further comprising:

feedback divide means, coupled between the oscillator means and the phase detect means, for dividing the interior clock by a divisor greater than one to generate the feedback clock, wherein the feedback clock has a lower frequency than the interior clock.

19. The phase-noise-canceling clock generator of claim 18 wherein the filter means includes capacitor means for storing charge.

20. The phase-noise-canceling clock generator of claim 19 wherein the error signal has a maximum value near zero hertz while the interior clock has a secondary maxima near a loop bandwidth of the phase-noise-canceling clock generator.

* * * * *